United States Patent [19]

Okumura

[11] Patent Number: 4,764,212
[45] Date of Patent: Aug. 16, 1988

[54] THERMOELECTRIC MATERIAL FOR LOW TEMPERATURE USE AND METHOD OF MANUFACTURING THE SAME

[75] Inventor: Takuji Okumura, Hiratsuka, Japan

[73] Assignee: Kabushiki Kaisha Komatsu Seisakusho, Tokyo, Japan

[21] Appl. No.: 16,265

[22] Filed: Feb. 19, 1987

[30] Foreign Application Priority Data

Feb. 21, 1986 [JP] Japan .................................. 61-035337
Jul. 30, 1986 [JP] Japan .................................. 61-177662

[51] Int. Cl.$^4$ ............................................. B22F 1/00
[52] U.S. Cl. ........................................ 75/228; 75/0.5 B; 264/6; 264/8; 419/33; 419/62; 419/66; 420/577; 420/590; 420/903
[58] Field of Search .............. 419/33, 62, 66; 264/6, 264/8; 420/590, 903, 577; 75/0.5 B, 228

[56] References Cited

U.S. PATENT DOCUMENTS

| | | | |
|---|---|---|---|
| 4,347,076 | 8/1982 | Ray et al. ................................ | 75/249 |
| 4,395,464 | 7/1983 | Panchanathan et al. ............. | 419/48 |
| 4,404,028 | 9/1983 | Panchanathan et al. ............. | 75/244 |
| 4,410,490 | 10/1983 | Ray et al. .............................. | 420/454 |
| 4,473,402 | 9/1984 | Ray et al. .............................. | 75/238 |
| 4,589,918 | 5/1986 | Nishida et al. ........................ | 75/244 |
| 4,592,781 | 6/1986 | Cheney et al. ........................ | 419/30 |
| 4,613,371 | 9/1986 | Cheney et al. ........................ | 75/255 |

FOREIGN PATENT DOCUMENTS 3815421 8/1963 Japan .

OTHER PUBLICATIONS

W. M. Yim and A. Amith, "Bi-Sb Alloys for Magneto-Thermoelectric and Thermomagnetic Cooling", *Solid State Electronics*, 1972, vol. 5, pp. 1141-1165.
T. Aono and S. Aizawa, "Study on Thermal Gap of Bi-Sb Alloys", (Tokyo) Denki Univ.), pp. 36-47.

*Primary Examiner*—Stephen J. Lechert, Jr.
*Attorney, Agent, or Firm*—Ronald P. Kananen

[57] ABSTRACT

This invention relates to a method of manufacturing thermoelectric material which has the steps of quenching a thermoelectric alloy in a molten state at a quenching rate higher than $10^{3°}$ C./sec into a membrane or powdery form and subjecting the membrane or powder to cold-forming or sintering. The thermoelectric alloy is a Bi—Sb series alloy having a composition represented by $$\{(Bi_{100-x} \cdot Sb_x)_{100-y} \cdot E^{II}_y\}_{100-z} \cdot E^{I}_z$$

where $E^I$ represents a group III or group IV element, $E^{II}$ represents a group IV or group VI element, x represents a number of 5–20, y represents an integer of 0–20 and z represents a number of 0.05–10, respectively.

21 Claims, 5 Drawing Sheets

× 30,000
0.3μ

×1000
10μ

THERMOELECTRIC MATERIAL FOR LOW TEMPERATURE USE AND METHOD OF MANUFACTURING THE SAME

BACKROUND OF THE INVENTION

1. Field of the Invention

This invention concerns a Bi—Sb series thermoelectric material showing high performance at low temperature (77°–200° K.), as well as a method of manufacturing such material.

More specifically, the invention relates to a thermoelectric material composition of a p-type Bi—Sb series alloy which is useful as a leg member for an electronic cooling module utilizing the Peltier effect, or a leg member for use in a cold heat source power generating medium utilizing the Seebeck effect that has not yet been obtained, as well as a method of manufacturing the same.

2. Description of the Prior Art

Heretofore, a process of subjecting powder to molding and sintering (hereinafter referred to as a press sinter method) or to a hot press method has been used for the manufacture of thermoelectric material.

The characteristics of the thermoelectric material are represented by the figure of merit Z:

$$Z \equiv \alpha^2 \times \sigma / K$$

where
- $\alpha$: Seebeck constant
- $\sigma$: electroconductivity
- $K$: heat conductivity While $\alpha$ has no substantial effect from the crystal grain size, $\alpha$ and K become smaller generally as the crystal grain size becomes finer.

It has been reported in the literature for a Si—Ge series thermoelectric material (Rowe, Sinter Theory Pract. p. 487–495, 1982) that if the grain size becomes finer exceeding a certain extent, only K becomes smaller while $\sigma$ remains unchanged.

Accordingly, since the figure of merit Z becomes greater as the crystal grain size becomes finer, the press sinter method or the hot press method using a powder of fine crystal grain size has generally been used.

Further, it has been generally known that the Bi—Sb series alloy forms an n-type semiconductor having a band gap of about 0.015 eV within a restricted range at a low temperature region (for instance $Bi_{95}Sb_5$—$Bi_{80}Sb_{20}$ at 4.2° K.) and that an excellent Peltier effect is shown in the low temperature region (refer, for example, to Japanese Patent Publication No. Sho 38-15421).

In fact, the n-type Bi—Sb alloy is an intrinsic semiconductor, in which electrons and positive holes are present substantially in a equal number. However, it has been said that since the mobility of the electrons is greater than that of the positive holes, it shows an n-type conduction (refer, for example, to T. Aono and S. Aizawa in "Study on Thermal Gap of Bi—Sb Alloys", Tokyo Denki Univ.).

Further, it has also been reported that while single crystals of Bi—Sb in which group IV elements, Sn, Pb, and so forth are solid-solubilized by several hundreds ppm show a p-type conduction in a cryogenic, so-called, impurity region, they turn to the n-type as the temperature increases (refer, for example, to W. Yim and A. Amith, Solid-State Electronics, 1972, Vol. 15, p. 1141–1165).

Accordingly, it is impossible to manufacture Bi—Sb series alloys which form a p-type from the cryogenic temperature near the room temperature by a Bridgeman or zone melting method intending for the manufacture of single crystals and, therefore, such p-type Bi—Sb alloys have not yet been found and manufactured.

In the following descriptions, only Bi—Sb alloys forming a p-type from the cryogenic to room temperature are referred to as the p-type Bi—Sb alloy.

In this way, although Bi—Sb alloys are widely known as thermoelectric materials showing high performance at low temperature, since only the n-type material can be prepared, it has not at present been put to practical use as the leg member for an electronic cooling module.

Further, although the powder used for the press sinter method or the hot press method as described above is generally prepared by mechanical pulverization, since the amount of impurities incorporated is increased during pulverization over a long period of time, those having an average grain size of about several microns are used. As a result, the crystal grain size of the obtained sintering product is also of about several microns and it is impossible to manufacture thermoelectric material having a finer crystal grain size.

SUMMARY OF THE INVENTION

This invention has been achieved in view of the foregoing situation and the object thereof is to provide a method of manufacturing thermoelectric material having an excellent figure of merit Z by quenching a thermoelectric alloy in a molten state to prepare membrane or powdery products having a sub-micron order of crystal grain size, and cold-molding and sintering them thereby obtaining a thermoelectric material having a sub-micron order of crystal grain size.

Another object of this invention is to provide a Bi—Sb alloy forming a p-type from cryogenic to room temperature, as well as a method of manufacturing the same.

A further object of this invention is to provide a Bi—Sb series thermoelectric material showing high performance at a low temperature, for example, 77°–200° K. which is useful as a leg member for an electronic cooling module or leg member for a cold heat source generating module, and so forth as well as a method of manufacturing such material.

For attaining the various objects as described above, there is provided, by the first aspect according to this invention, a method of manufacturing a thermoelectric material comprising cooling a thermoelectric alloy in a molten state at a cooling rate of greater than $10^3$° C./sec into membrane or powdery products, and then cold-forming or sintering these membrane or powdery products.

According to a second aspect of this invention, there is provided a method of manufacturing thermoelectric material, wherein the thermoelectric alloy in the first aspect is a Bi—Sb series alloy comprising a composition represented by $\{(Bi_{100-x} \cdot Sb_x)_{100-y} \cdot E^{II}_y\}_{100-z} \cdot E^{I}_z$, (where $E^I$ represents a group III or IV element, $E^{II}$ represents a group IV or VI element, x represents a number from 5 to 20, y represents a number from 0 to 20 and z represents a number from 0.05 to 10 respectively).

Further, there is provided by the third aspect according to this invention, a method manufacturing thermoelectric material, wherein the cooling rate in the case of using the Bi—Sb series alloy in the second aspect is such a cooling rate at which the alloy mentioned above can be in a non-equilibrium phase.

Furthermore, there is provided by the fourth aspect according to this invention, a method of manufacturing thermoelectric material, wherein $E^I$ represents a group IV element and $y=0$ in the second aspect.

Still further, there is provided by the fifth aspect according to this invention, a method of manufacturing thermoelectric material which comprises putting the Bi—Sb series alloy in the second aspect into a molten state, and then cooling and solidifying the molten alloy by jetting out onto a metal roll of about 200 mm diameter and 20 mm width rotating at 500–4000 rpm at a jetting pressure of from 0.5 to 4 kg/cm$^2$.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENTS

This invention will further be described more in detail while referring to the accompanying drawings.

Figure 1:
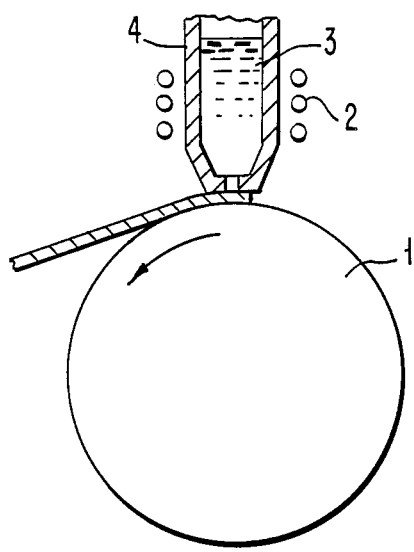
FIG. 1 is a schematic constitutional view illustrating one embodiment of a device for practicing the method of manufacturing a thermoelectric material according to this invention.

In the method of obtaining thermoelectric material having a sub-micron order of crystal grain size, thermoelectric alloy 3 is charged in a molten pool 4 and heated by high frequency coils 2, and the thermoelectric alloy 3 is rendered into a molten state as shown in FIG. 1.

While rotating a metal roll 1 (about 200 mm diameter and 20 mm width) at a circumferential speed from 5 to 40 m/sec, molten metal is jetted out by an inert gas (pressure: 0.1 kg/cm$^2$–4 kg/cm$^2$) from the molten metal pool 4 onto the roll 1 to prepare a membrane or powder.

Thermoelectric material is prepared by cold-molding (or cold-forming) or sintering the membrane or powder.

In the manufacturing method for the thermoelectric material as described above, since crystallization occurs everywhere upon quenching, a membrane or powdery thermoelectric material having a sub-micron order of crystal grain size can be obtained. Then, the thermoelectric material having a sub-micron order of crystal grain size can be obtained by cold-molding or sintering at a temperature below the crystal grain size coarsing temperature.

As a result, it is possible to manufacture a thermoelectric material having a figure of merit Z more excellent than the thermomoelectric material prepared by the conventional press sinter method or hot press method.

EXAMPLE 1

A thermoelectric alloy having a $Bi_{88}Sb_{12}$ composition was heated to about 600° C. into a liquid phase. The molten alloy was jetted to a Cu roll rotating at a circumferential speed of about 10 m/sec, which is substantially equal to the circumferential speed of a 200 mm diameter roll when rotated at 500 rpm, at a gas jetting pressure of about 1.0 km/cm$^2$ to prepare a membrane of about 20 mm length, about 2 mm width and about 30 $\mu$m thickness.

Figure 2:
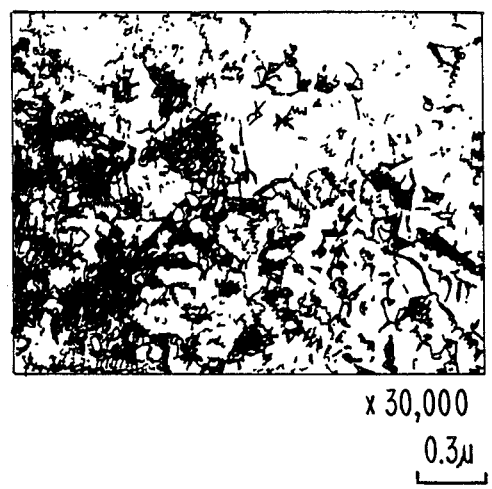
FIG. 2 is a drawing of a photograph for the texture observed under a transmission electron microscope of 30,000 magnifying ratio of a thin film of thermoelectric material obtained in Example 1 according to this invention.

When the membrane was observed under a transmission electron microscope of 30,000 X, it had a texture shown by the drawing of the photograph in FIG. 2.

COMPARATIVE EXAMPLE 1

A thermoelectric alloy having a $Bi_{88}Sb_{12}$ composition was heated to about 600° C. into a liquid phase. An ingot after cooling in the furnace from the liquid state was pulverized in a ball mill for about 5 hours and then sintered in an Ar atmosphere at about 180° C. and 300 kg/cm$^2$ of pressure for 10 minutes.

Figure 3:
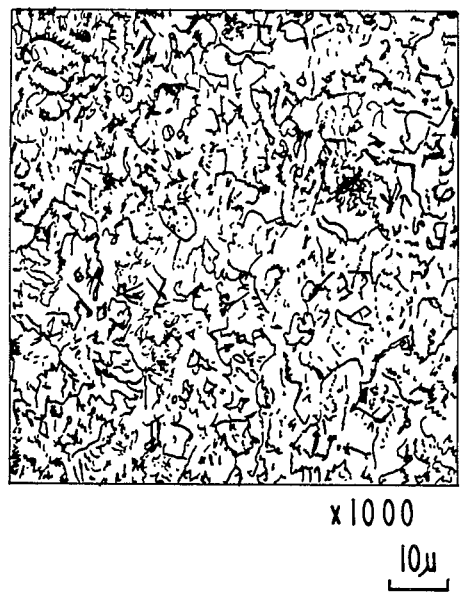
FIG. 3 is a drawing of a photograph for the texture observed under an optical microscope of 1000 magnifying ratio of sintering products of thermoelectric material obtained in Comparative Example 1.

When the sintering product was observed under 1000 X optical microscope, it has a texture shown by the drawing of the photograph in FIG. 3.

Comparative Example 1 shows one example of the thermoelectric material prepared by the hot press method which is the prior art as described above. The crystal grain size of the sintering product is several microns. Although a sintering product of finer crystal grain size can be obtained by using ultra-fine grains as the powder, it is not practical since the cost for the thermoelectric material is increased.

As shown in Example 1, a quenched membrane having a sub-micron order of crystal grain size could easily be obtained by the method according to this invention. By bundling the membranes together a subjecting them to cold working, and supplying an electrical current in the direction perpendicular to the direction of the film thickness, it can be used as thermoelectric material having excellent performance.

Quenched powder having a sub-micron order of crystal grain size can be obtained by changing the number of the roll rotation and the jetting pressure upon quenching. In the case of preparing a sintering product by hot pressing the quenched powder, the production work is carried out below a temperature at which the crystal grains become coarser.

In the quenching method, that is, in the method according to this invention, the shape of the quenching product changes from the membrane to the powdery state as the number of the roll rotation is increased and as the jetting pressure is lowered. If the number of the roll rotation is below the circumferential speed of 5 m/sec and the jetting pressure increases higher than 4 kg/cm$^2$, disadvantages are brought about, such as an increase in the thickness of the membrane to reduce the quenching rate and winding of the membrane around the roll. On the other hand, if the number of the roll rotation increases to greater than 40 m/sec of the circumferential speed and the jetting pressure goes lower than 0.1 kg/cm$^2$, the powder becomes finer to worsen the recovery rate.

Similar effects can also be obtained by the method other than the quenching method using the roll shown in Example 1, that is, an atomizing method and spin-desk method, if the powder or membrane is prepared at a quenching speed of greater than 10$^3$° C./sec and then subjecting them to cold-forming or sintering. Besides, similar effects can also be obtained by using at least one of other thermoelectric alloys than the above-described Bi—Sb series thermoelectric alloy, that is, Bi—Te, Pb—Te, Si—Ge, Fe—Si and Ge—Te series thermoelectric alloys.

Further, it has been found by the study of the present inventors that the following composition is required for obtaining a p-type Bi—Sb alloy.

$$\{(Bi_{100-x}Sb_x)_{100-y} \cdot E^{II}{}_y\}_{100-z} \cdot E^{I}{}_z$$

where $E^I$ represents group III or group IV element, $E^{II}$ represents a group IV or a group VI element, x represents 5-20, y represents 0-20 and z represents 0.05-10, in which it may sometimes be necessary for obtaining the alloy composition described above to prepare a forced solid-solution by using a quench roll method from the state where a complete 1-liquid phase is formed.

That is, a Bi—Sb series thermoelectric material according to this invention is prepared by using $Bi_{100-x}Sb_x$ (where x=5-20) forming an intrinsic semiconductor as the Bi—Sb series matrix alloy, adding the group III or IV element by 0.05-10 at % as the p-type dopant and further adding 0-20 at % of group IV, VI elements as required for improving the performance of the thermoelectric material upon practical use. In the case of adding the group IV element as the p-type dopant, it is not necessary to add the group IV, VI element.

The p-type Bi—Sb alloy can be obtained in accordance with the method of this invention by solidifying a Bi—Sb series alloy in the molten state at a quenching speed capable of forming a non-equilibrium phase. Specifically, a Bi—Sb series alloy 3 is charged to a molten alloy pool 4 in the device as shown in FIG. 1 and heated by the high frequency coil 2 to thereby render the Bi—Sb series alloy into a molten state. While on the other hand, the metal roll 1 (about 200 mm$\phi$ and 20 mm width) is rotated at 500-4000 rpm, while the molten alloy is jetted out under an inert gas pressure (0.5-4 kg/cm$^2$) onto the roll to be quenched and solidified. It may be possible to prepare the p-type Bi—Sb alloy, not by using the quenching roll method, but by a method of rapid solidification (for example, a quenched powder) capable of adding a greater amount of p-dopant than in the equilibrium solidification. Further, since no quenched membrane at good quality can be obtained in the quenching roll method described above unless the production conditions are set within the range for the number of roll rotation from 500 to 4000 rpm and the gas jetting pressure from 0.5 to 4 kg/cm$^2$, the conditions are preferably set within the above-mentioned range.

While it is possible to add the p-type dopant only by an amount solid-solubilized in the equilibrium solidification (about several hundreds ppm) in the conventional Bridgeman method or zone melting method, it is possible to add the p-dopant by the amount more than that in the equilibrium solidification and, as a result, the p-type Bi—Sb alloy that could not yet be manufactured can be made.

That is, as has been described above for the prior art, while the Bi—Sb alloy incorporated with the group IV element by several hundreds of ppm in the equilibrium solidification turns from p to n type as the temperature increases (refer to FIG. 6), a Bi—Sb alloy showing the p-type conduction at 77° K.—room temperature can be obtained by adding from 0.05 to 10 at % of the group III or group IV element as the p-type dopant to the intrinsic semiconductor of $Bi_{100-x}Sb_x$ (x=5-20) (refer to FIGS. 4, 7, 8 and 9).

In the case of the Bi—Sb alloy in which the p-type dopant Sn is added by an amount less than that for equilibrium coagulation by the conventional method, although the alloy forms a p-type since the positive hole density is higher than the electron density due to the p-type dopant Sn at low temperature, it forms an intrinsic conduction region where the concentrations of positive holes and the electrons are substantially equal to each other as the temperature increases. Accordingly, electrons of greater mobility become predominant for the conduction and the conduction type turns to the n-type (refer to FIG. 6). A similar phenomenon is also reported for the group IV element Pb, etc. other than Sn (for example, refer to G. E. Smith and R. Wolfe, Journal of Applied Physics, Vol. 33, 841 (1962)). On the contrary, it is considered that in the case of adding from 0.05 to 10 at % of the p-dopant which is greater than the equilibrium solidification amount as in this invention, since the positive hole concentration is still higher than the electron concentration near the room temperature due to the group III element (Al, Tl, etc.) or group IV elements (Sn, Pb, etc.) added, it shows p-type conduction.

If the addition amount of the group III element or group IV element is less than 0.05 at %, the p-type conduction is no longer shown in the vicinity of the room temperature. On the other hand, it is not practical to increase the addition amount of the element by greater than 10 at % (for the practical use, the carrier concentration is controlled to about $10^{19}$-$10^{20}$).

Further, in the p-type Bi—Sb alloy according to this invention, group IV and group VI elements may be added within a range not impairing the p-type conduction for lowering the heat conductivity and improving the performance of the thermoelectric material upon practical use. As a matter of fact, an addition of the group IV, VI elements is not necessary. Addition of the group IV, VI elements in excess of 20 at % is not desirable since the thermoelectric performance as the Bi—Sb series alloy is impaired.

EXAMPLE 2

Sn was added by 1 at % as the p-type dopant to a Bi—Sb alloy having the composition: $Bi_{88}Sb_{12}$ and heated to about 600° C. into a uniform liquid phase in an Ar atmosphere at about 1 atm. The molten alloy was jetted out from the state onto a Cu roll rotating at about 1000 rpm under a gas jetting pressure of about 1.0 kg/cm$^2$ to prepare a membrane of about 20 mm length, about 2 mm width and about 30 μm thickness.

Figure 4:
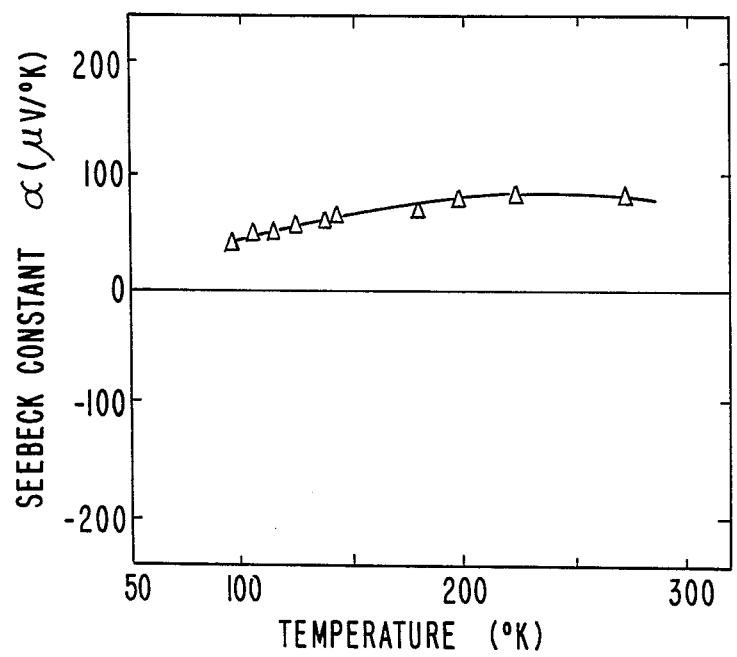
FIG. 4 is a graph illustrating the temperature-dependent change of the Seebeck constant for a p-type Bi—Sb alloy membrane obtained in Example 2 according to this invention.

When the Seebeck constant of the thus obtained membrane was measured, the results shown in FIG. 4 were obtained.

COMPARATIVE EXAMPLE 2

Figure 5:
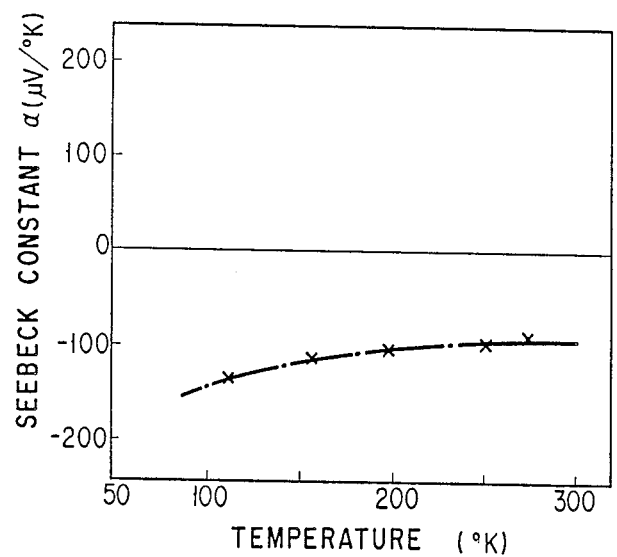
FIG. 5 is a graph illustrating the temperature-dependent change of the Seebeck constant for a conventional n-type Bi—Sb alloy membrane obtained in Comparative Example 2.

A quenched membrane having the composition: $Bi_{88}Sb_{12}$ was prepared in the same method procedures as in Example 1 and the Seebeck constant thereof was measured to obtain results as shown in FIG. 5.

COMPARATIVE EXAMPLE 3

An alloy having the same composition as that in Example 2 was formed into a uniform liquid phase at 600° C., solidified by the Bridgeman method at a temperature slope of about 40° C./cm and a solidifying rate of 0.76 mm/hr to prepare a Bi—Sb device of 10 mm diameter and 150 mm length.

Figure 6:
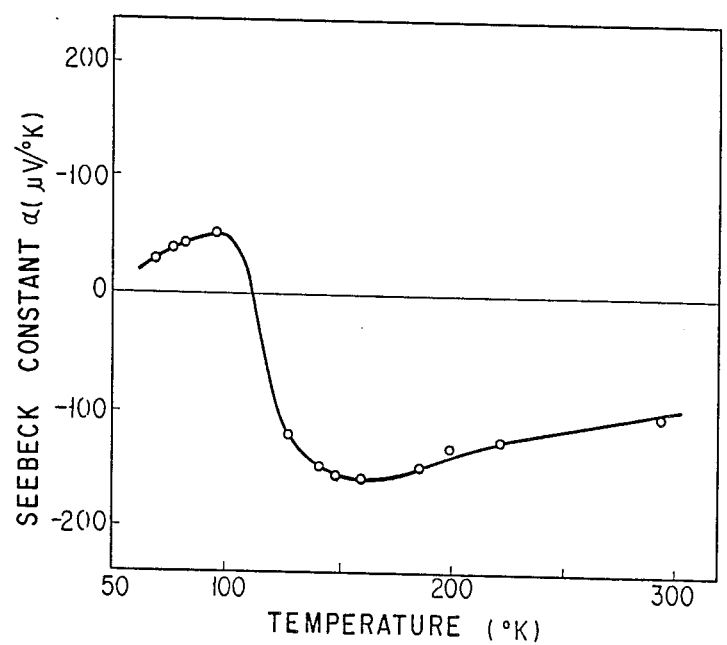
FIG. 6 is a graph illustrating the temperature-dependent change of the Seebeck constant for a Bi—Sb element prepared by a Bridgeman method.

When the Seebeck constant at the central portion of the device was measured, the results as shown in FIG. 6 were obtained.

As is apparent from FIG. 4, the Seebeck constant of the alloy membrane prepared in Example 2 (membrane obtained by solidifying the molten alloy having the composition: $(Bi_{88}Sb_{12})_{99}Sn_1$ by the quenching method) was positive as far as 77° K.—room temperature, that is, it shows the p-type conduction. While on the other hand, as shown in FIG. 5, the Seebeck constant of the alloy having the composition: $Bi_{88}Sb_{12}$ in Comparative Example 1 is negative as far as till 77° K.—room temperature, that is, it shows the n-type conduction. The situation is the same for the alloys of $Bi_{100-x}Sb_x$, x=5-20, not containing the p-type dopant.

While on the other hand, as shown in FIG. 6, the Seebeck constant of the device prepared from the molten alloy having the composition: $(Bi_{88}Sb_{12})_{99}Sn_1$ in Comparative Example 3 by the Bridgeman method (since only about 0.03 at % of Sn can be solid-solubilized into $Bi_{88}Sb_{12}$ if prepared by the Bridgeman method, it is actually impossible to prepare the composition: $(Bi_{88}Sb_{12})_{99}Sn_1$ and it only forms single crystals containing 0.03 at % Sn to $Bi_{88}Sb_{12}$) turns from positive to negative along with an increase of the temperature as shown in FIG. 6, that is, it turns from the p-type to the n-type.

EXAMPLE 3

Figure 7:
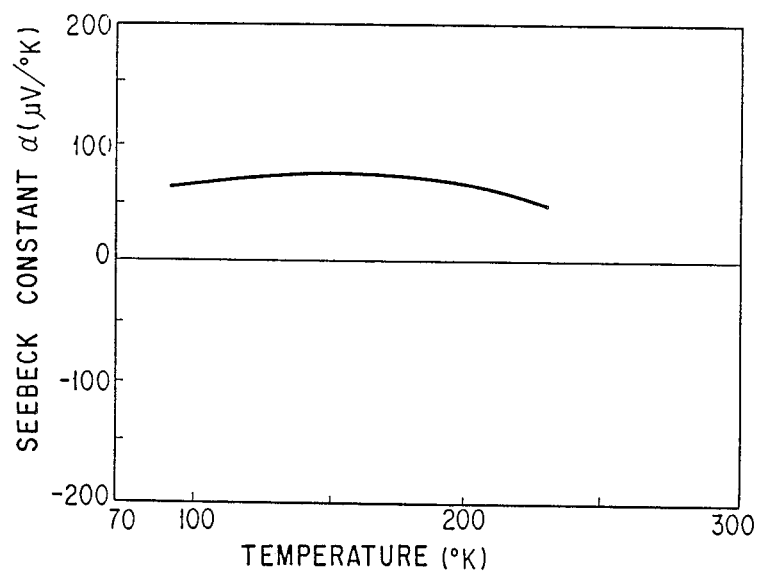
FIGS. 7, 8 and 9 are graphs illustrating the temperature-dependent change of a the Seebeck constant of p-type Bi—Sb alloy membrane prepared in Examples 3, 4 and 5 respectively according to this invention.

A quenched membrane having the composition: $\{(Bi_{88}Sb_{12})_{95}(PbSe)_5\}_{99}Ga_1$ was prepared in the same procedures as in Example 1 and when the Seebeck constant thereof was measured, the results as shown in FIG. 7 were obtained.

EXAMPLE 4

Figure 8:
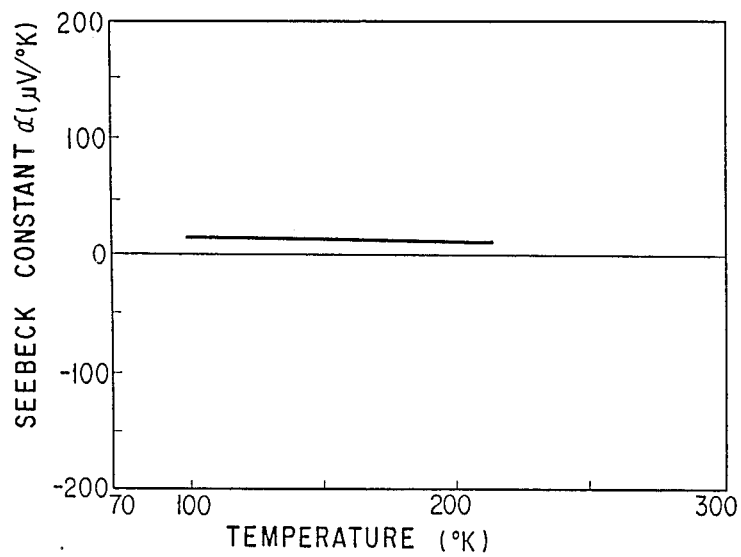

A quenched membrane having the composition: $\{(Bi_{88}Sb_{12})_{95}(PbTe)_5\}_{99}Tl_1$ was prepared in the same procedures as in Example 1 and when the Seebeck constant thereof was measured, the results as shown in FIG. 8 were obtained.

EXAMPLE 5

Figure 9:
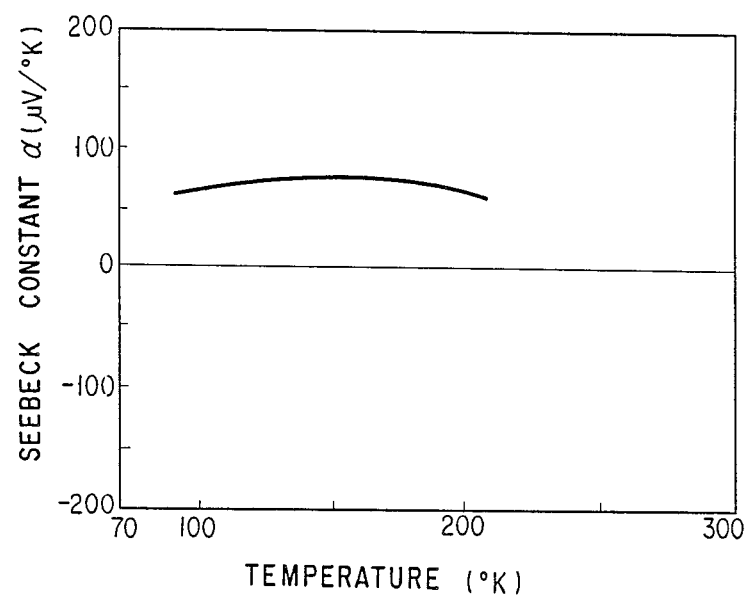

A quenched membrane having the composition: $\{(Bi_{88}Sb_{12})_{94}(PbSe)_6\}_{99}Al_1$ was prepared in the same procedures as in Example 2 and when the Seebeck constant thereof was measured, the results as shown in FIG. 9 were obtained.

As has been explained above according to this invention, thermoelectric material having a sub-micron order of crystal grain size can be obtained, by quenching the thermoelectric alloy in a molten state, crystallization occurs everywhere to produce a membrane or powdery produce having a sub-micron order of crystal grain size and, by subjecting them to cold-forming or sintering.

It is to be understood that the foregoing description is merely illustrative of the preferred embodiments and examples of the present invention and that the scope of the invention is not to be limited thereto. Additional modifications or alterations of the invention will readily occur to one skilled in the art without departing from the scope of the invention.

What is claimed is:

1. A method of manufacturing thermoelectric material, comprising the steps of:
   quenching a thermoelectric alloy in a molten state at a quenching rate higher than $10^3$ C./sec into a membrane or powdery form and subjecting the membrane or powder to cold-forming or sintering while maintaining the alloy in a metastable state.

2. A method of manufacturing thermoelectric material as defined in claim 1, wherein the thermoelectric alloy is a Bi—Sb series alloy having a composition represented by $$\{(Bi_{100-x} \cdot Sb_x)_{100-y} \cdot E^{II}_y\}_{100-z} \cdot E^{I}_z$$

where $E^I$ represents a group III or group IV element, $E^{II}$ represents a group IV or group VI element, x represents a number of 5-20, y represents an integer of 0-20 and z represents a number of 0.05-10, respectively.

3. A method of manufacturing thermoelectric material as defined in claim 2, wherein the Bi—Sb series alloy of the above-mentioned composition put to the molten state is quenched at a quenching rate capable of forming the nonequilibrium phase.

4. A method of manufacturing thermoelectric material as defined in claim 2, wherein $E^I$ represents a group IV element and y=0.

5. A method of manufacturing thermoelectric material as defined in claim 2, wherein the Bi—Sb series alloy in the molten state is quenched to solidify by jetting out the molten alloy onto a metal roll of 200 mm diameter and 20 mm width rotating at 500-4000 rpm under a jetting pressure of from 0.5 to 4 kb/cm².

6. The method as set forth in claim 1, wherein the step of quenching produces a membrane or powdery thermoelectric material having a crystal grain size of a sub-micron order of magnitude and the step of cold-forming or sintering occurs at a temperature below the crystal grain size coarsing temperature.

7. The method as set forth in claim 2, wherein said Bi—Sb series alloy is prepared by using $Bi_{100-x}Sb_x$ (where x=5-20) forming an intrinsic semiconductor as the Bi—Sb series matrix alloy, adding the group II or group IV element as the p-type dopant within the stated range; and adding the group IV, VI elements as required for group III dopant.

8. The method as set forth in claim 2, wherein said Bi—Sb alloy when subjected to the quenching and forming steps shows a p-type conduction at about 77° K. to about room temperature.

9. The method as set forth in claim 7, wherein the step of adding a group III or group IV element is in an amount greater than the equilibrium solidification amount.

10. A metastable thermoelectric Bi—Sb series alloy having a composition comprising:

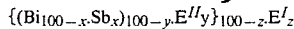

where Ei represents a group III or group IV element, $E^{II}$ represents a group IV or group VI element, x represents a number of 5-20, y represents an integer of 0-20 and z represents a number of 0.05-10, respectively.

11. The alloy of claim 10, wherein $E^I$ represent a group IV element and y=0.

12. A method of preparing a massive solid thermoelectric semiconductor alloy having a dopant concentration greater than the equilibrium solubility of the dopant comprising the steps of:
  (a) forming a solid alloy in powder or thin laminar form by chiling a molten semiconductor alloy composition containing a dopant in a concentration greater than the equilibrium solubility of the dopant in the solid semiconductor alloy at a cooling rate greater than $10^3$° C. per second, and
  (b) compacting said powder or thin laminar alloy by heat and pressure under conditions of temperature and time chosen to prevent substantial precipitation of the dopant.

13. The method of claim 1 wherein said alloy is a Bi—Sb series alloy.

14. A method of manufacturing thermoelectric material as defined in claim 13, wherein the thermoelectric alloy is a Bi—Sb series alloy having a composition represented by

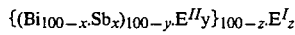

where $E^I$ represents a group III or group IV element, $E^{II}$ represents a group IV or group VI element, x represents a number of 5-20, y represents an integer of 0-20 and z represents a number of 0.05-10, respectively.

15. A method of manufacturing thermoelectric material as defined in claim 14, wherein the Bi—Sb series alloy of the above-mentioned composition put to the molten state is quenched at a quenching rate capable of forming the non-equilibrium phase.

16. A method of manufacturing thermoelectric material as defined in claim 14, wherein $E^I$ represents a group IV element and y=0.

17. A method of manufacturing thermoelectric material as defined in claim 14, wherein the Bi—Sb series alloy in the molten state is quenched to solidify by jetting out the molten alloy onto a metal roll of 200 mm diameter and 20 mm width rotating at 500-4000 rpm under a jetting pressure of from 0.5 to 4 kg/cm².

18. The method as set forth in claim 13, wherein the step of quenching produces a membrane or powdery thermoelectric material having a crystal grain size of a sub-micron order of magnitude and the step of cold-forming or sintering occurs at a temperature below the crystal grain size coarsing temperature.

19. The method as set forth in claim 14, wherein said Bi—Sb series alloy is prepared by using $Bi_{100-x}Sb_x$ (where x=5-20) forming an intrinsic semiconductor as the Bi—Sb series matrix alloy, adding the group III or group IV element as the p-type dopant within the stated range; and adding the group IV, VI elements as required for group III dopant.

20. The method as set forth in claim 19, wherein said Bi—Sb alloy when subjected to the quenching and forming steps shows a p-type conduction at about 77° K. to about room temperature.

21. The method as set forth in claim 19, wherein the step of adding a group III or group IV element is in an amount greater than the equilibrium solidification amount.

* * * * *